United States Patent
Fowler

(10) Patent No.: US 9,928,893 B1
(45) Date of Patent: Mar. 27, 2018

(54) CIRCULAR PRINTED MEMORY SYSTEM AND METHOD HAVING ROBUSTNESS TO ORIENTATION

(71) Applicant: XEROX CORPORATION, Norwalk, CT (US)

(72) Inventor: Jeffrey M. Fowler, Rochester, NY (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 15/613,668

(22) Filed: Jun. 5, 2017

(51) Int. Cl.
  *G11C 11/22* (2006.01)
  *H01L 27/11507* (2017.01)

(52) U.S. Cl.
  CPC ........ *G11C 11/2273* (2013.01); *G11C 11/221* (2013.01); *H01L 27/11507* (2013.01)

(58) Field of Classification Search
  CPC .................................................. G11C 11/221
  USPC ....................................................... 365/145
  See application file for complete search history.

(56) References Cited

U.S. PATENT DOCUMENTS

| | | | |
|---|---|---|---|
| 2013/0020679 A1* | 1/2013 | Nagai | H01L 22/14 257/532 |
| 2015/0263274 A1* | 9/2015 | Miyata | H01L 43/12 335/302 |
| 2017/0068830 A1 | 3/2017 | Fowler | |

OTHER PUBLICATIONS

Blair et al., "Circular Printed Memory Device with Rotational Detection," U.S. Appl. No. 15/450,856, filed Mar. 6, 2017.
Doody et al., "XEROX Printed Memory Grid Connector," U.S. Appl. No. 15/498,219, filed Apr. 26, 2017.

* cited by examiner

*Primary Examiner* — Hoai V Ho
(74) *Attorney, Agent, or Firm* — MH2 Technology Law Group LLP

(57) ABSTRACT

A circular memory device includes a plurality of bottom electrodes, a plurality of top electrodes, a ferroelectric layer, and a plurality of memory storage locations within the ferroelectric layer at a crossover point of each of the bottom electrodes and each top electrode. Contact pads of the bottom electrodes and top electrodes may include a perimeter that defines an annular sector that allows a memory operation to be performed on the circular memory device across a range of rotational positions. In an example implementation, the memory operation may be performed on the circular memory device regardless of the rotational orientation of the circular memory device relative to a reader.

20 Claims, 12 Drawing Sheets

CIRCULAR PRINTED MEMORY SYSTEM AND METHOD HAVING ROBUSTNESS TO ORIENTATION

TECHNICAL FIELD

The present teachings relates generally to printed memory devices and, more particularly, to circular memory devices with rotational detection and methods for creating the same.

BACKGROUND

Printed memory devices may include a plurality of memory locations or memory cells that store a plurality of bits of information or data bits. The printed memory device includes a plurality of parallel top electrodes (i.e., conductor lines) and a plurality of parallel bottom electrodes, where the bottom electrodes are arranged perpendicular to the top electrodes. The plurality of electrodes forms a matrix of intersecting crossover points, where each crossover point is a memory storage location. Each data bit is stored through a state of an active layer sandwiched between two crossing electrodes. Each electrode is thereby used to access a plurality of memory locations and data bits.

Each electrode may terminate in a contact pad that has an increased dimension and/or surface area to mitigate electrical coupling with the electrode. The contact pads for the plurality of bottom electrodes may be arranged with each other linearly. Further, the contact pads for the plurality of top electrodes may be arranged with each other linearly. To perform a memory operation (e.g., a read and/or a write) to a memory location, the bottom electrode and the top electrode that forms the crossover point of the memory location is electrically accessed using the contact pads. The memory operation may be performed by a device such as a reader that a plurality of probes arranged to physically and electrically contact the plurality of contact pads.

The printed memory devices may be used for a variety of different applications. For example, the printed memory devices may store a combination of data bits that can be used for identification or other applications.

SUMMARY

The following presents a simplified summary in order to provide a basic understanding of some aspects of one or more implementations of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an implementation, a memory device includes a plurality of bottom electrodes including a plurality of bottom electrode contact pads and a plurality of bottom electrode extended members, wherein: each of the plurality of bottom electrode contact pads is in electrical communication with one of the bottom electrode extended members; each of the plurality of bottom electrode contact pads includes a first arc-shaped midline bisecting the bottom electrode contact pad and positioned at a first radius from a center of the memory device; and a perimeter of each bottom electrode contact pad defines an annular sector bisected by the first arc-shaped midline. In this implementation, the memory device further includes a plurality of top electrodes including a plurality of top electrode contact pads and a plurality of top electrode extended members, wherein: each of the plurality of top electrode contact pads is in electrical communication with one of the top electrode extended members; each of the plurality of top electrode contact pads includes a second arc-shaped midline bisecting the top electrode and positioned at a second radius from the center of the memory device, wherein the first radius is different from the second radius; and a ferroelectric layer positioned between the plurality of bottom electrode extended members and the plurality of top electrode extended members.

In another implementation, a memory system includes a circular memory device, the circular memory device having a plurality of bottom electrodes including a plurality of bottom electrode contact pads and a plurality of bottom electrode extended members, wherein: each of the plurality of bottom electrode contact pads is in electrical communication with one of the bottom electrode extended members; each of the plurality of bottom electrode contact pads includes a first arc-shaped midline bisecting the bottom electrode contact pad and positioned at a first radius from a center of the circular memory device; and a perimeter of each bottom electrode contact pad defines an annular sector bisected by the first arc-shaped midline. The circular memory device further includes a plurality of top electrodes including a plurality of top electrode contact pads and a plurality of top electrode extended members, wherein: each of the plurality of top electrode contact pads is in electrical communication with one of the top electrode extended members; each of the plurality of top electrode contact pads includes a second arc-shaped midline bisecting the top electrode and positioned at a second radius from the center of the circular memory device, wherein the first radius is different from the second radius; and a ferroelectric layer positioned between the plurality of bottom electrode extended members and the plurality of top electrode extended members. The memory system further includes a reader configured to perform a memory operation on the circular memory device, the reader including a plurality of probes configured to electrically couple to the plurality of bottom electrode contact pads and the plurality of top electrode contact pads.

An implementation of method for performing a memory operation on a circular memory device includes placing a reader in physical contact with the circular memory device, detecting whether every primary probe of a plurality of primary probes of the reader is electrically coupled to one electrode of a plurality of electrodes of the circular memory device, responsive to every primary probe of the plurality of primary probes being electrically coupled to one electrode of the plurality of electrodes, performing the memory operation on the circular memory device using the plurality of primary probes, responsive to every primary probe of the plurality of primary probes not being electrically coupled to one electrode of the plurality of electrodes, detecting whether every secondary probe of a plurality of secondary probes of the reader is electrically coupled to one electrode of a plurality of electrodes of the circular memory device, and responsive to every secondary probe of the plurality of secondary probes being electrically coupled to one electrode of the plurality of electrodes, performing the memory operation on the circular memory device using the plurality of secondary probes.

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures.

It should be noted that some details of the FIGS. have been simplified and are drawn to facilitate understanding of the present teachings rather than to maintain strict structural accuracy, detail, and scale.

DETAILED DESCRIPTION

Reference will now be made in detail to exemplary implementations of the present teachings, examples of which are illustrated in the accompanying drawings. Wherever possible, the same reference numbers will be used throughout the drawings to refer to the same or like parts.

An implementation of a circular memory device is described in U.S. patent application Ser. No. 15/450,856 filed Mar. 6, 2017, titled "Circular Printed Memory Device with Rotational Detection," and incorporated herein by reference in its entirety. The circular memory device disclosed includes a top electrode including a center member and a plurality of bottom electrodes, where each bottom electrode includes a circular contact area and an extended member. A memory operation such as a read and/or write may be performed on this circular memory device by contacting the center member of the top electrode and one of the bottom electrode circular members. To read a specific memory cell, a pin or probe of a reader, for example, is precisely aligned with the circular member of the specific memory cell. If the circular memory device is rotated, the probe may physically contact a circular member of a different memory cell. As the reader includes a plurality of probes, and the design of the circular memory device includes features that allow the reader to determine the rotational orientation, the reader may read the specific memory cell using a different electrical contact of the reader.

The present disclosure broadly discloses a circular printed memory device (referred to as "circular memory device" or "memory device") having a robustness with regard to rotational orientation. In one implementation, the memory device may be successfully read by a contact of a reader when the memory device is positioned across a range of rotational orientations.

Figure 1:
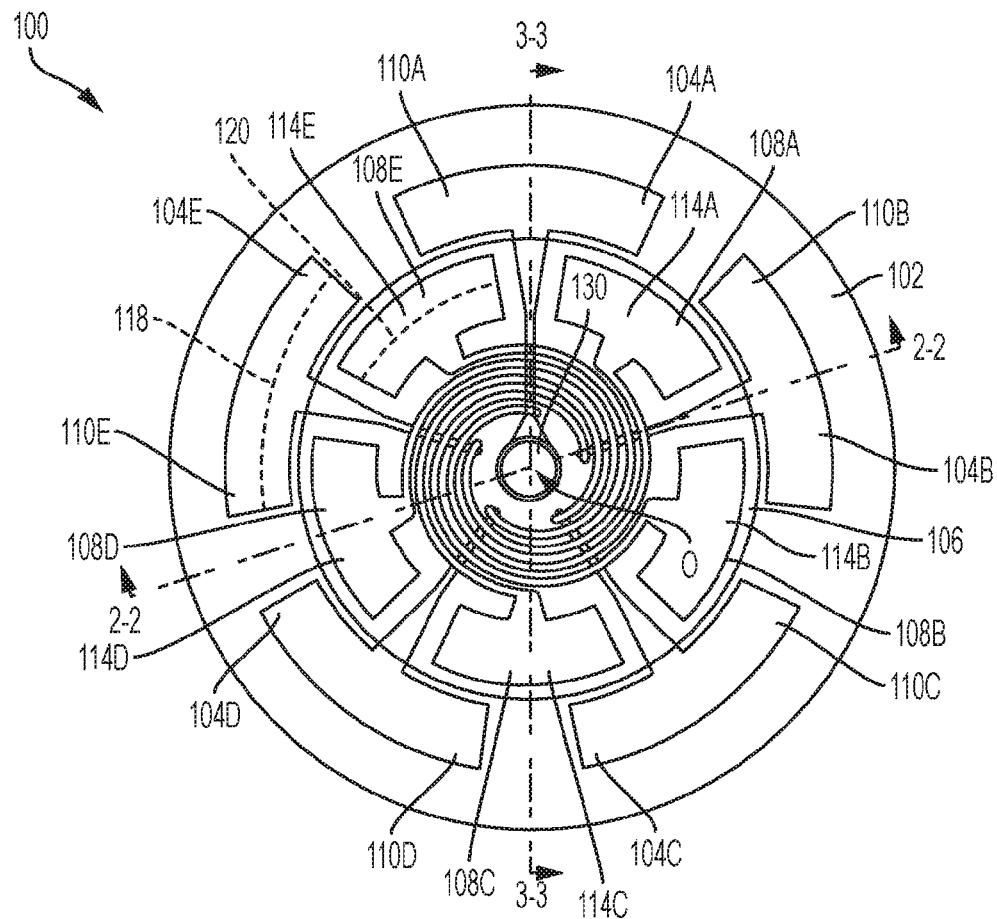
FIG. 1 is a plan view of a circular memory device in accordance with an implementation of the present teachings.
Figure 2:
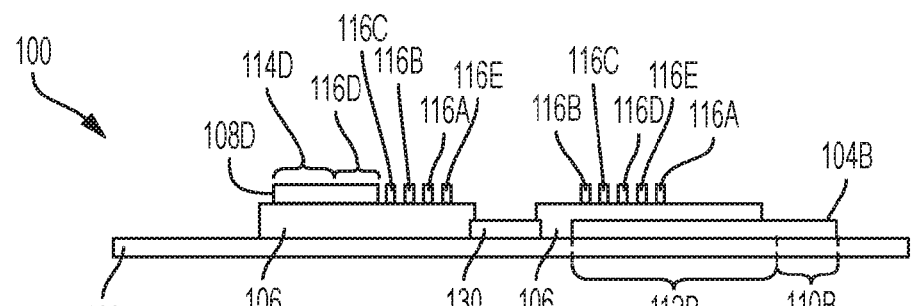
FIG. 2 is a schematic cross section along 2-2 of FIG. 1.
Figure 3:
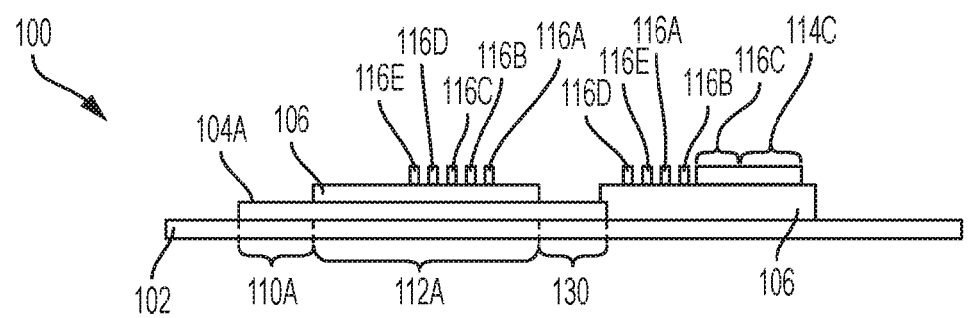
FIG. 3 is a schematic cross section along 3-3 of FIG. 3.

A memory device 100 in accordance with an implementation of the present teachings is depicted in the plan view of FIG. 1, the cross section of FIG. 2 taken along "2-2" of FIG. 1, and the cross section of FIG. 3 taken along "3-3" of FIG. 1. The memory device 100 includes a base substrate 102, a plurality of bottom electrodes 104A-104E (referred to herein individually as a bottom electrode 104 and/or collectively as bottom electrodes 104), a ferroelectric layer 106, and a plurality of top electrodes 108A-108E (referred to herein individually as top electrode 108 and/or collectively as top electrodes 108). In one implementation, the base substrate 102, the bottom electrodes 104, the ferroelectric layer 106 and the top electrodes 108 may be layered on top of one another, where the ferroelectric layer 106 is positioned between the bottom electrodes 104 and the top electrodes 108. It will be appreciated that a memory device 100 in accordance with an implementation of the present teachings may include other structures and/or features that have not been depicted for simplicity, and that depicted structures and/or features may be removed or modified.

In an implementation, the base substrate 102 may be a flexible material that provides a flexible base substrate 102. For example, the flexible material may be or include a flexible plastic, for example, polyethylene naphthalate (PEN), polyethylene terephthalate (PET), and the like.

The base substrate 102 may be provided as a continuous sheet. For example, the base substrate 102 may be rolled and fed through an assembly line that produces a plurality of circular memory devices 100. The base substrate 102, and thus each circular memory device 100, may then be stamped or cut out of the continuous sheet of the base substrate 102.

The plurality of bottom electrodes 104 and the plurality of top electrodes 108 may be fabricated from one or more layers of conductive material, for example, copper, gold, silver, aluminum, a metal alloy, and the like.

In an implementation, each bottom electrode 104A-104E may include a contact pad 110A-110E and an extended member 112A-112E. The contact pad 110 and the extended member 112 associated with each memory cell may be a single continuous structure (e.g., formed from the same electrically conductive layer or layers). Further, each top electrode 108A-108E may have a contact pad 114A-114E and an extended member 116A-116E. The contact pad 114 and the extended member 116 associated with each memory cell may also be a single continuous structure. The contact pads 110, 114 provide a relatively large surface to which an array of probes or pins of a reader may make physical and electrical contact to the bottom electrodes 104 and top electrodes 108. In an implementation, each contact pad 110, 114 in the plan view of FIG. 1, may have a perimeter that defines a shape of an annular sector as depicted. Each of the contact pads 110A-110E of the bottom electrodes may have a first surface area that is about the same as each of the other contact pads 110A-110E, and each of the contact pads 114A-114E of the top electrodes may have a second surface area that is about the same as the other contact pads 114A-114E, where the first surface area is larger than the second surface area.

The plurality of bottom electrodes 104 may be arranged in a circular pattern over the base substrate 102 with the contact pads 110 positioned toward an outer perimeter of the memory device 100 and the extended members 112 oriented toward (e.g., pointing toward) a center "O" of a memory device 100. (As depicted in FIG. 1, the center "O" of the memory device 100 is the position at the intersection of lines 2-2 and 3-3.) Each contact pad 110 of each bottom electrode 104 may have a first arc-shaped midline 118 that extends through and bisects the contact pad 110, where each point of the first midline 118 is a first distance from the center "O".

Any type of ferroelectric material may be used for the ferroelectric layer 106. In one implementation, the ferroelectric layer 106 may include a polymer containing fluorine such as polytetrafluoroethylene (PTFE), perfluoroalkoxy (PFA), polyvinylidene fluoride (PVDF), trifluoroethylene (TFE), and the like, or combinations thereof. Other ferroelectric materials and/or combinations of materials are contemplated for use as the ferroelectric layer 106.

The plurality of top electrodes 108 may also be arranged in a circular pattern on the base substrate 102 with the contact pads 114 toward the center "O". As depicted in FIG. 1, the extended members 116 of the top electrodes 108 may be arranged in interleaving or interdigitated spirals so that they do not intersect each other (i.e., are non-intersecting). As depicted, each top electrode 108 may cross over every bottom electrode 104, with a memory cell formed at each crossover point. Each contact pad 114 of each bottom electrode 104 may have a second arc-shaped midline 120 that extends through and bisects the contact pad 114 as an arc, where each point of the second midline 120 is a second distance from the center "O", where the second distance is less than the first distance.

FIGS. 1-3 depict a memory device with five bottom electrodes 104 and five top electrodes 108. The depicted memory device 100 thus includes 25 memory cells, where each memory cell is positioned at the crossover point of one of the bottom electrodes 104 and one of the top electrodes 108. A memory device according to the present teachings may include more or less than 25 memory cells, depending on the number of bottom electrodes 104 and top electrodes 108.

As the operation of a ferroelectric memory is known in the art, the electrical operation of the memory device 100 is only briefly described herein. Generally, a data bit having either a "0" state or "1" state is stored within the ferroelectric layer 106 at the location of the crossover point of each bottom electrode 104 with each top electrode 108. A polarization vector of ferroelectric crystals within the ferroelectric layer determines which data bit is stored. One of the data bits may be selectively stored in the memory cell, or read from the memory cell, by applying suitable voltages to the bottom electrode 104 and the top electrode 108 paired with the particular memory location.

One of the bottom electrodes (i.e., bottom electrode 104A in the depiction of FIGS. 1-3) may include (e.g., be electrically coupled with) an optional center contact pad 130 positioned at the center "O," and is thus referred to herein as an "orienting electrode" or "orientation electrode." The center contact pad 130 is electrically coupled to (i.e., in electrical communication with) the extended member 112A, and is further connected to the contact pad 110A through the extended member 112A. In an implementation, the memory device 100 may include only one orienting electrode, where the center pad 130 is electrically coupled with only one bottom electrode. A perimeter of the center contact pad 130 defines a circle as depicted in FIG. 1. During use, a first probe from an array of probes of a reader may be positioned to electrically contact the center contact pad 130 while a second probe may be positioned to electrically contact one of the contact pads 110A-110E. If a low electrical resistance is measured between the first probe and the second probe, it may be determined that the second probe is physically contacting bottom electrode 104A and the orientation of the circular memory device is thereby known. Conversely, if a high electrical resistance is measured between the first probe and the second probe, it may be determined that the second probe is physically contacting one of bottom electrodes 104B-104E. In practice, as described below, a reader may include five probes (or, in other implementations, more than five or fewer than five) with one probe contacting each of the bottom electrodes 104A-104E such that the orientation of the circular memory device 110 may be determined.

Figure 4:
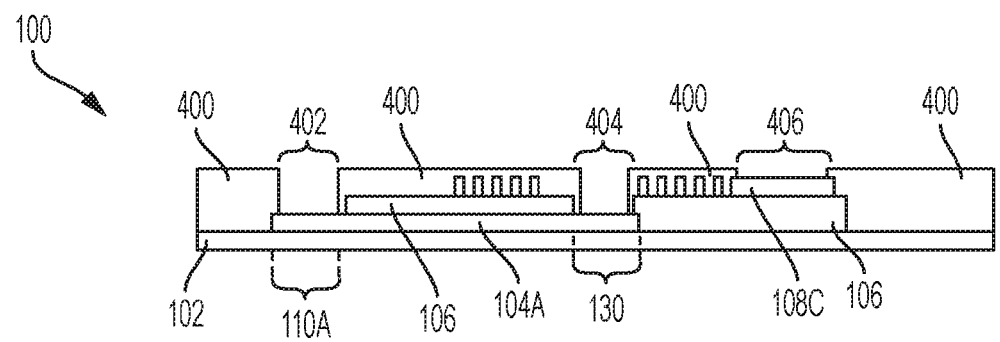
FIG. 4 depicts the FIG. 3 structure including an optional passivation layer.

A memory device 100 may include, for example, a dielectric passivation layer 400 as depicted in FIG. 4 to protect device structures. If used, the passivation layer 400 may include openings therein to expose various conductive structures to allow electrical contact with, for example, a probe for testing, reading, and/or writing the memory device 100. As depicted in FIG. 4, the passivation layer 400 includes a plurality of first contact openings 402 that expose and allow electric contact to each of the bottom electrode contact pads 110, a second contact opening 404 that exposes and allows electrical contact to the center contact pad 130, and a plurality of third contact openings 406 that expose and allow electrical contact to each of the top electrode contact pads 114.

Figure 5:
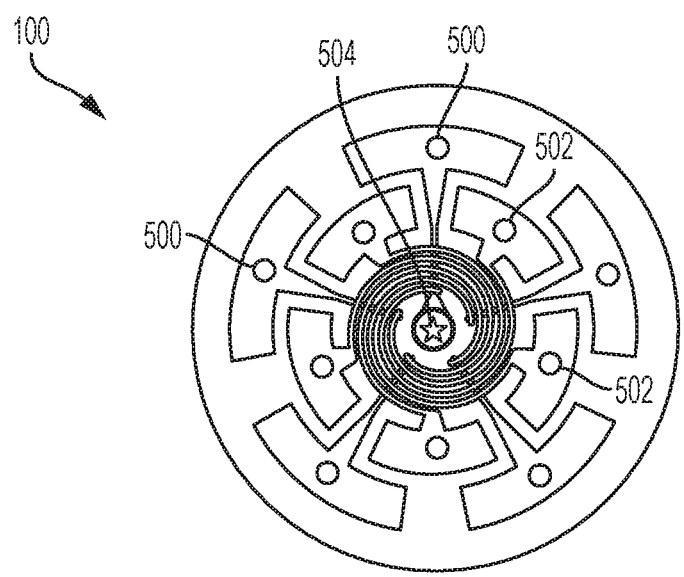
FIG. 5 depicts the FIG. 1 structure physically and electrically contacted by probes of a reader.

To perform a memory operation (e.g., a read and/or write operation, a test operation, an electrical characterization operation, etc.) on the memory device 100, a plurality of contact pins or probes of, for example, a reader may be placed in electrical contact with the plurality of contact pads 110 of the bottom electrodes 104 and with the plurality of contact pads 114 of the top electrodes 108 as depicted in the schematic plan view of FIG. 5. FIG. 5 depicts the memory device 100 of FIG. 1 and a set or plurality of primary electrode probes or primary probes 500-504 that physically and electrically contact the contact pads 110, 114, 130. The plurality of primary probes may be or include part of an array of contact probes of the reader. The primary probes 500-504 include a plurality of primary bottom electrode probes 500 that contact the bottom electrodes 104 toward an outer radius of the circular memory device 100, a plurality of primary top electrode probes 502 that contact the top electrodes 108 at an intermediate radius of the circular memory device 100, and a center pad probe 504 that contacts the center contact pad 130 toward the center "O" of the circular memory device 100. For purposes of illustration, the bottom electrode probes 500 and the top electrode probes 502 have been depicted as circles and the center contact probe 504 has been depicted as a star, but it will be understood that each of the contact probes 500-504 will generally have the same shape, although different shapes are contemplated.

Figure 6:
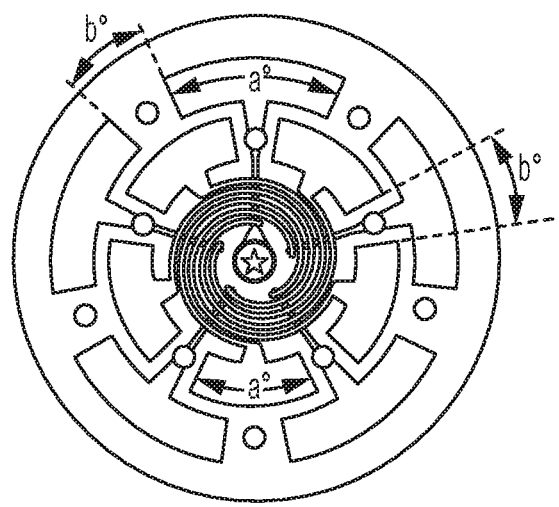
FIG. 6. depicts the FIG. 1 structure misaligned with probes of a reader.

In the implementation of the FIG. 5 plan view, and as discussed above, each of the contact pads 110, 114 may be formed as, or has the shape of, an annular sector. Each annular sector may extend through a° of a circle (i.e., may extend along an arc of a°) as depicted in FIG. 6. The angle of a° depends, at least in part, on the number of bottom electrode contact pads 110 or the number of top electrodes 108. In the depicted implementation, the number of bottom electrode contact pads 110 (i.e., five) equals the number of top electrode contact pads 114 (i.e., five), and thus the number of each may be designated as "N". The angle of a° also depends at least in part on the gap between adjacent contact pads for the respective electrode type which, in FIG. 6, is b°. The contact pads 110, 114 may be evenly distributed about the center "O". The gap of b° between adjacent annular sectors may be calculated as b°=(360°/N−a°). In an implementation, b° may be greater than the width of the primary probes 500-504 such that probes 500-504 cannot bridge or span between adjacent bottom electrode contact pads 110 or between top electrode contact pads 114.

For example, in the FIG. 6 implementation, N=5 and thus 72° (360°/5) is available for a°+b°. If a° is designated or selected to be 52.6°, then b°=72°−52.6°=19.4°. Thus in this implementation, with regard to FIG. 5, the memory device 100 can be rotated through 52.6° (i.e., 26.3° clockwise or 26.3° counterclockwise with respect to the FIG. 5 orientation) while maintaining physical and electrical contact between the probes 500, 502 and each of the respective contact pads 110, 114. Thus the FIG. 5 device that includes contact pads 110, 114 that have a shape of an annular sector has an increased tolerance to rotational misalignment compared to devices having round or square contact pads.

The depiction of FIG. 5 is generally an ideal contact state between the probes 500-504 and the contact pads 110, 114, 130, as each of the primary probes 500-504 physically contact a center of each contact pad 110, 114, 130. FIG. 6 depicts the FIG. 5 structures where the reader and the set of primary probes 500-504 are rotated 35° relative to the memory device 100. In this case, only the center pad probe 504 makes electrical contact to the memory device 100, and thus a memory operation to the memory device would not be successful. With respect to rotational misalignment, FIG. 6 generally depicts a worst case contact state between the probes 500-504 and the contact pads 500, 502.

Figure 7:
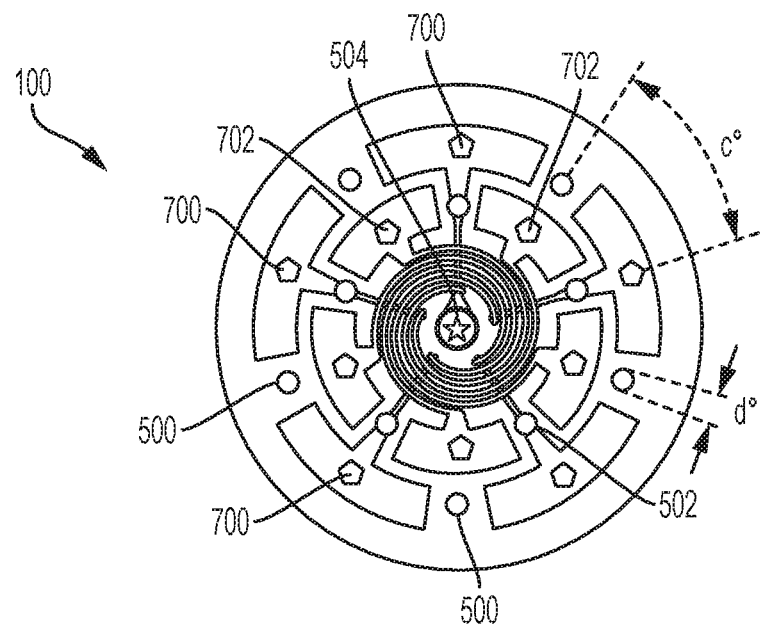
FIG. 7 depicts the FIG. 1 structure electrically contacted by probes of a reader.

To overcome the rotational misalignment as depicted in FIG. 6, which would not result in a successful memory operation, a set or plurality of secondary electrode probes or secondary probes are contemplated. The plurality of secondary probes may be or include part of the array of contact probes of the reader. The plurality of second electrode probes are rotated from the position of the set of primary probes, where the secondary probes are the same distance from the center "O". FIG. 7 depicts the memory device 100 of FIG. 6 and the primary probes 500-504, as well as the set of secondary probes 700, 702. For purposes of illustration, secondary probes 700, 702 have been depicted as pentagons, but it will be understood that each of the contact probes 500-504, 700, 702 will generally have the same shape, although different shapes are contemplated. The secondary probes 700, 702 include a plurality of secondary bottom electrode probes 700 that contact the bottom electrodes 104 toward the outer radius of the circular memory device 100, and a plurality of secondary top electrode probes 702 that contact the top electrodes 108 at the intermediate radius of the circular memory device 100.

The secondary probes 700, 702 are rotated "c°" about the center point relative to the primary contacts 500, 502. In FIG. 7, c°=29°. This "rotation offset" has a value of c° that is determined, at least in part, by the value of N, as well as the contact area (designated herein as "d°") between the reader probe and the contact pad. As depicted in FIG. 7, the contact area between the reader probe and the contact pad subtends d°, and is about 5.5°. For a°, b°, c°, and d° measured as described above, the values may be selected and the reader may be designed such that b°<c°+d°<a°. The contact pads thus have N-fold rotational symmetry. If further the geometry is selected with appropriate tolerances, this relationship may be maintained for any relative position of the reader to the printed memory device within a specified tolerance window, e.g. any relative position for which the central contact on the reader contacts the central contact pad on the device.

As depicted in FIG. 7, the primary bottom electrode probes 500 and the secondary bottom electrode probes 700 are each positioned a first distance (i.e., at a first radius) from a center of the probe array, where the center of the probe array is the center of center pad probe 504 positioned at the center of the probe array. The primary top electrode probes 502 and the secondary top electrode probes 702 are each positioned a second distance (i.e., at a second radius) from the center of the probe array, where the second distance is less than the first distance.

Figure 8:
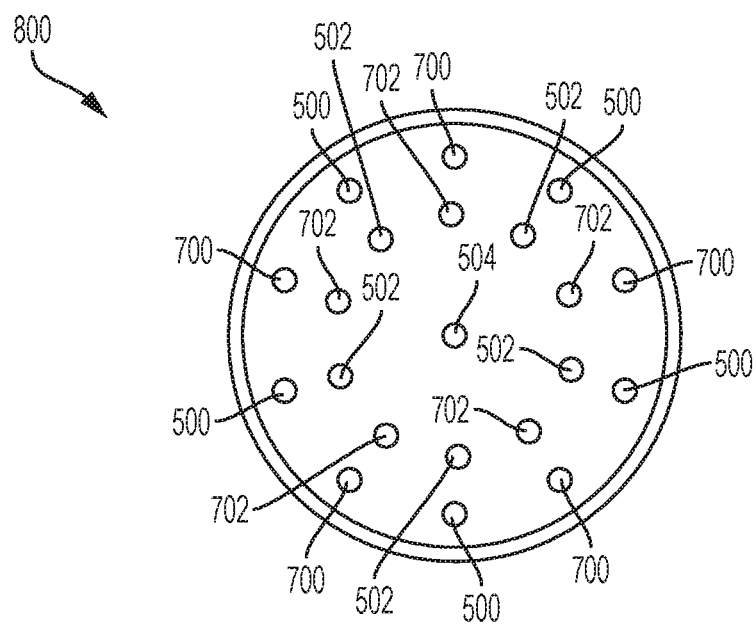
FIG. 8 is a plan view depicting probes of a reader.

FIG. 8 is an end view of a reader 800, where the reader 800 includes the plurality of primary bottom electrode probes 500, the plurality of secondary bottom electrode probes 700, the plurality of primary top electrode probes 502, the plurality of secondary top electrode probes 702, and the center pad probe 504. The probes 500-504, 700, 702 may be, for example, Pogo® pins, probe tips, or another type of probe.

Figure 9:
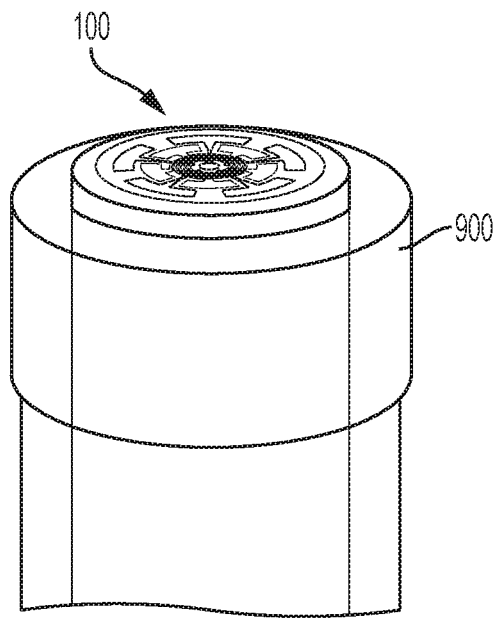
FIG. 9 is a perspective depiction of the FIG. 1 device attached to a product.
Figure 10:
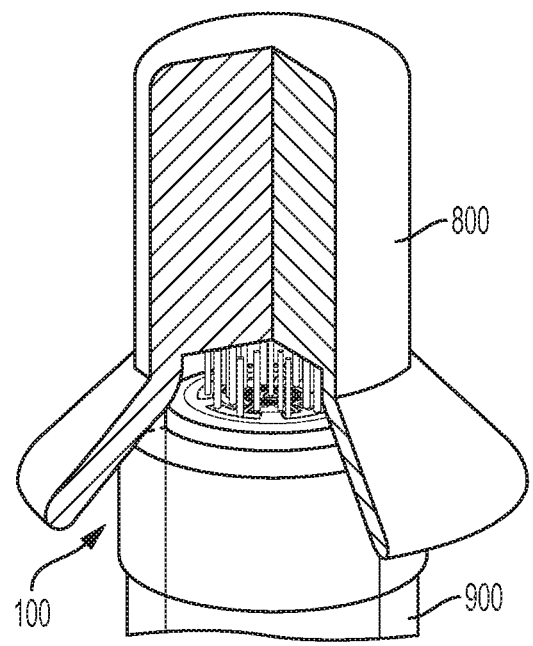
FIG. 10 is a perspective depiction of the FIG. 9 structure in physical and electrical contact with a reader that may perform a memory operation on the device of FIG. 1.

It will be understood from the description herein that the reader 800 may be placed in physical and electrical contact with the circular memory array 100 in any rotational orientation, and a memory operation may be successfully performed in any rotational orientation, assuming the center pad probe 504 is aligned with the center contact pad 130. In an implementation, a system as described herein may be used where a positional relationship between the memory device 100 and the reader 800 may be accurately controlled, but a rotational relationship between the printed memory device and the reader is not, or may not be, strictly controlled. For example, FIG. 9 is a perspective depiction of a memory device 100 positioned onto a product 900 having a cylindrical shape or cylindrical section or projection. The memory device 100 may be positioned on a product 900 using a fastener (not individually depicted for simplicity) such as an adhesive layer or another fastener. The position of the product 900 within, for example, a production line may be accurately controlled, while the rotational alignment of the product 900 is not, or may not be, accurately controlled. As depicted in FIG. 10, the reader 800 may be aligned with the product 900 in any rotational orientation to perform a memory operation on the memory device 100. For example, the memory device 100 may be used to store manufacturing data, tracking data, inventory data, etc., specific to the product 900.

Figure 11A:
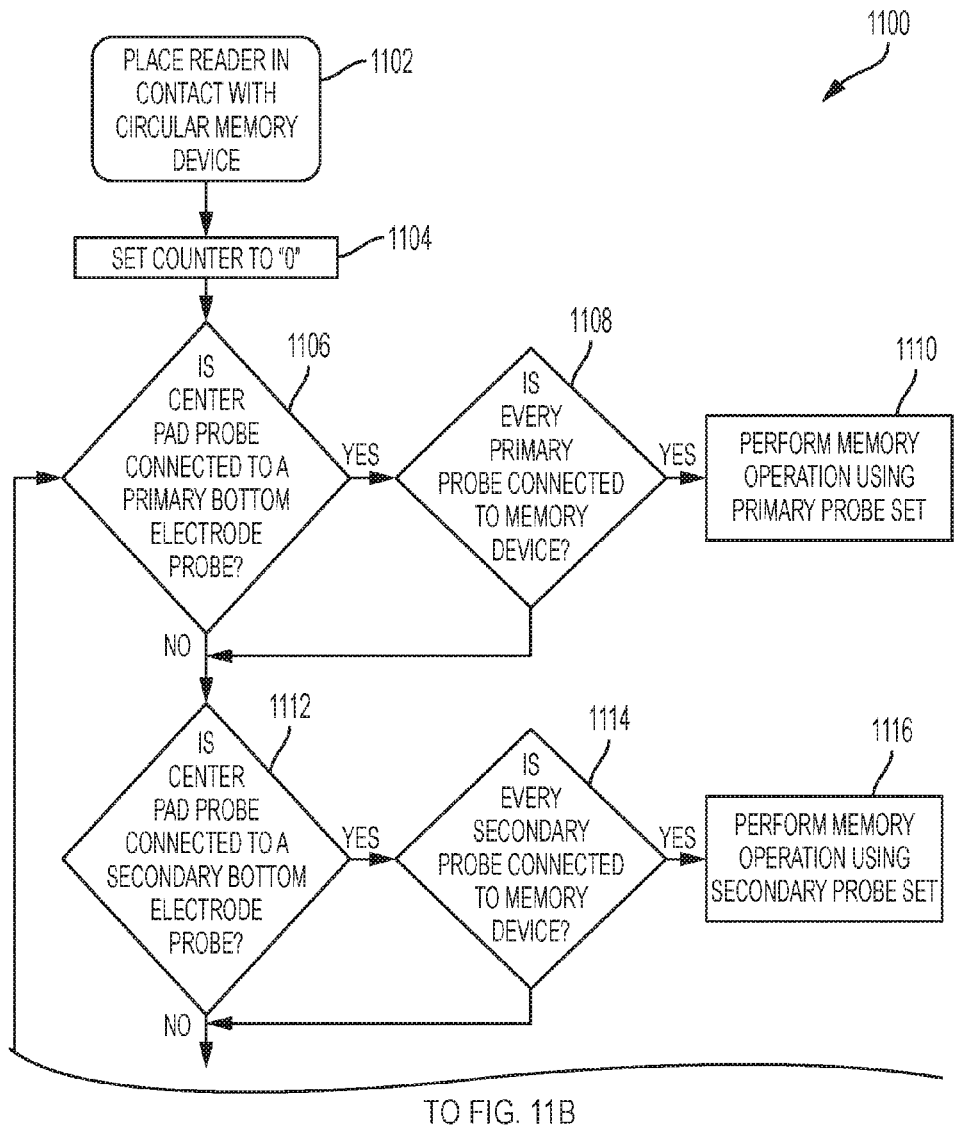
FIGS. 11A, 11B show a flow chart of a method that may be performed according to an implementation of the present teachings.
Figure 11B:
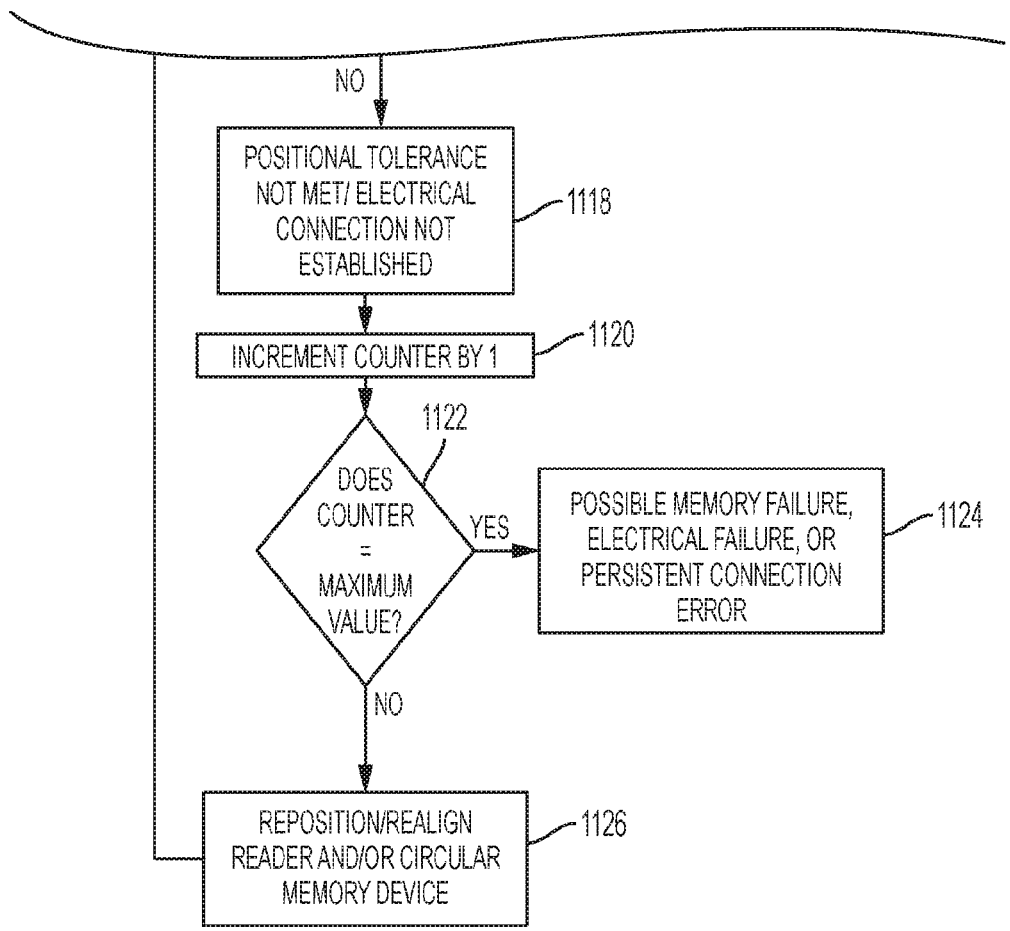

A method or process 1100 for performing a memory operation such as a read operation, a write operation, a functional test operation, a characterization test operation, or another operation on an integrated circuit (IC) 100 such as a circular memory device 100 is depicted in the flow diagram of FIGS. 11A, 11B. The method 1100 may proceed by operation or use of one or more of the structures depicted in the figures described above, and thus is described with reference to FIGS. 1-10; however, it will be appreciated that the method 1100 is not limited to any particular structure or use unless expressly stated herein. It will be appreciated that while the method 1100 is described as a series of acts or events, the present teachings are not limited by the ordering of such acts or events. Some acts may occur in different orders and/or concurrently with other acts or events apart from those described herein. Further, a method in accordance with the present teachings may include other acts or events that have not been depicted for simplicity, while other depicted acts or events may be removed or modified.

The method 1100 begins by placing the reader 800 in physical and/or electrical contact with the memory device 100 as at 1102, and an optional counter may be initialized and/or set to "0" as at 1104. The reader 800 then performs a sensor operation to determine whether the center pad probe 504 is electrically connected or coupled to one of the primary bottom electrode probes 500 as at 1106. As discussed above, a low measured electrical resistance between the center pad probe 504 and one of the primary bottom electrode probes 500 indicates that the two probes are each connected to one end of the orienting electrode (i.e., bottom electrode 104A in FIG. 1).

If the reader 800 determines that one of the primary bottom electrode probes 500 and the center pad probe 504 are each connected to one end of the orienting electrode 104A at 1106, the reader 800 performs a sensor operation to determine whether every primary probe 500, 502 is electrically connected or coupled to the memory device as at 1108. If the reader 800 confirms electrical connection at 1108, the memory operation is performed using the set of primary probes 500, 502 as at 1110. During the memory operation at 1110, the set of secondary probes 700, 702 may be electrically inactive (i.e., deactivated) to reduce or prevent electrical interference with the primary probes and/or the memory operation. If the electrical connection is not confirmed at 1108, the flow branches to 1112.

Referring to block 1106, if the center pad probe 504 is not electrically connected to one of the primary bottom electrode probes 500, the reader 800 performs a sensor operation to determine whether the center pad probe 504 is electrically connected or coupled to one of the secondary bottom electrode probes 700 as at 1112. If the reader 800 determines that one of the secondary bottom electrode probes 700 and the center pad probe 504 are each connected to one end of the orienting electrode 104A at 1112, the reader 800 performs a sensor operation to determine whether every secondary probe 700, 702 is electrically connected or coupled to the memory device 100 as at 1114. If the reader 800 confirms electrical connection at 1114, the memory operation is performed using the set of secondary probes 700, 702 as at 1116. During the memory operation at 1116, the set of primary probes 500, 502 may be electrically inactive (i.e., deactivated). If the electrical connection is not confirmed at 1114, the flow branches to 1118.

At 1118, the reader 800 has determined that positional tolerance between the reader 800 and the memory device 100 has not been met and/or electrical connection has not been established. At 1120, the optional counter may be incremented by 1, and then a value of the counter is compared to a pre-established maximum as at 1122. If the counter value equals the maximum, it is determined that a possible memory failure (e.g., failure of the memory device), electrical failure (e.g., failure of the reader 800), and/or other persistent connection error (e.g., a foreign insulator material positioned between the memory device 100 and the probes 500-504, 700, 702 of the reader 800) has occurred as at 1124.

If it is determined at block 1122 that the value of the counter is less than the pre-determined maximum, the reader 800 and/or the memory device 100 may be repositioned and/or realigned as at 1126, and the flow may return to block 1106.

Figure 12:
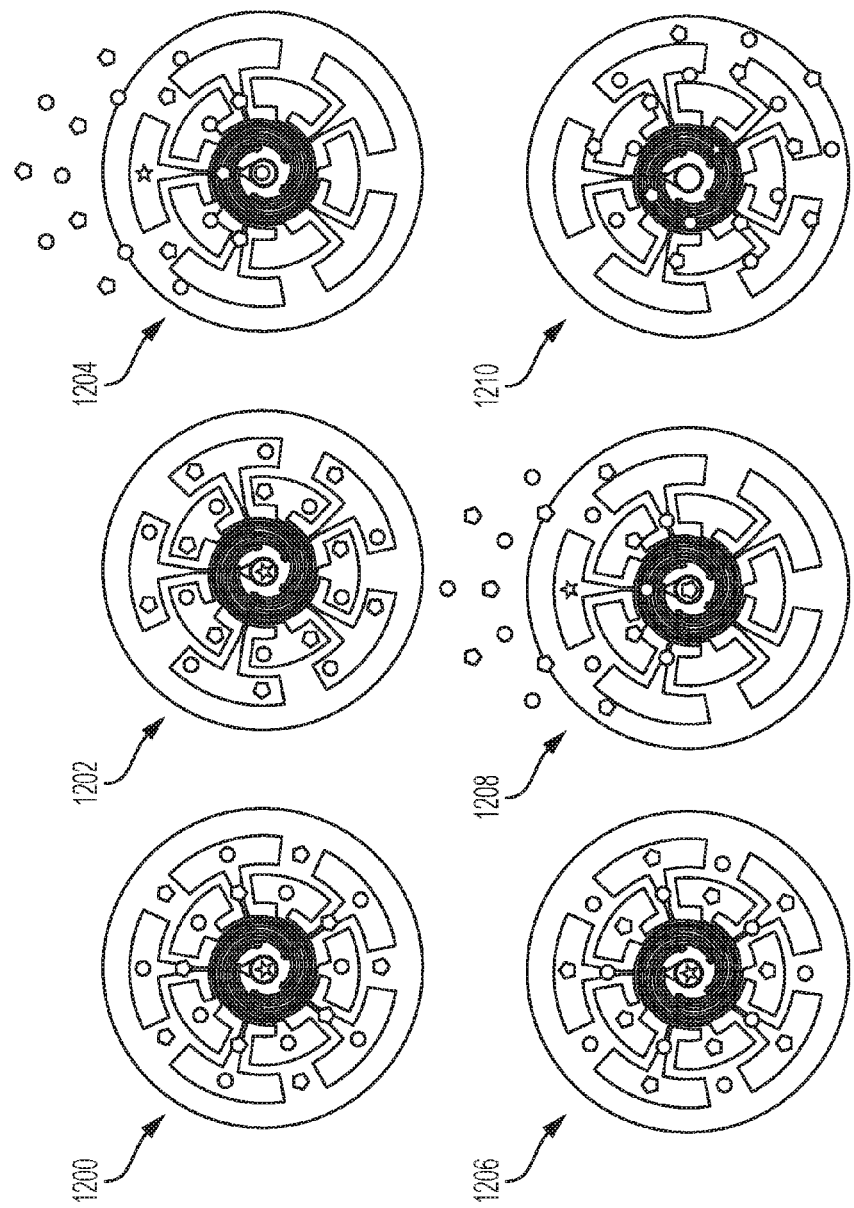
FIG. 12 depicts various possible alignments of a reader to the device of FIG. 1 during a method employing the flow chart of FIGS. 11A, 11B.

FIG. 12 depicts examples of physical and electrical connection states between the memory device 100 and the various probes of the reader 800 that result in various decisions of the FIG. 11A, 11B process flow. For example, any of states 1200, 1202, 1204 would result in a "yes" decision at block 1106, either of states 1200, 1202 would result in a "yes" decision at 1108, while state 1204 would result in a "no" decision at block 1108. Additionally, state 1204 would result in a "no" decision at block 1112, while either of states 1206, 1208 would result in a "yes" decision at block 1112. State 1206 would result in a "yes" decision at block 1114, while state 1208 would result in a "no" decision at block 1114. State 1210 would result in a "no" decision at both of blocks 1106 and 1112.

Figure 13:
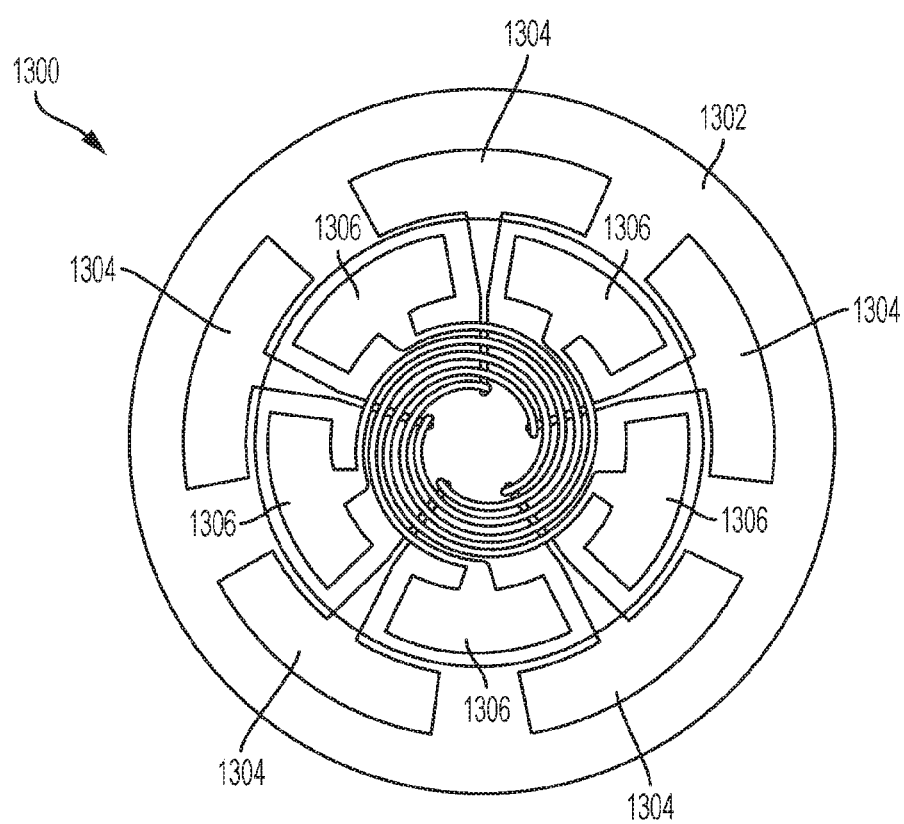
FIG. 13 is another implementation of a circular memory device in accordance with an implementation of the present teachings.

As discussed above, the center contact pad 130 of FIG. 1 is optional. FIG. 13 depicts a memory device 1300 that does not employ the use of a center contact pad. The memory device 1300 of FIG. 13 includes a base substrate 1302, a plurality of bottom electrodes 1304, and a plurality of top electrodes 1306. As the structure of FIG. 13 is analogous to the FIG. 1 structure, reference numbers for various analogous features have been omitted for simplicity. As this implementation omits the center pad which, in the FIG. 1 structure is used to determine rotational orientation of the memory device 100, a different scheme for determining the orientation of the memory device 1300 may be employed. For example, the scheme described in U.S. patent application Ser. No. 15/255,435, filed Sep. 2, 2016, and published on Mar. 9, 2017, as U.S. Patent Publication US2017/0068830A1, incorporated herein by reference in its entirety, may be applied to the device of FIG. 13. This incorporated disclosure describes a reader and a method that, in an implementation, compares symmetrically oriented bit pairs such that orientation of a memory device relative to a reader does not alter the determination of memory device contents. A reader for use with this implementation may appear similar to the reader 800 of FIG. 8 without a center probe 504, or with a center probe 504 that is not used to perform part of a memory operation.

Figure 14A:
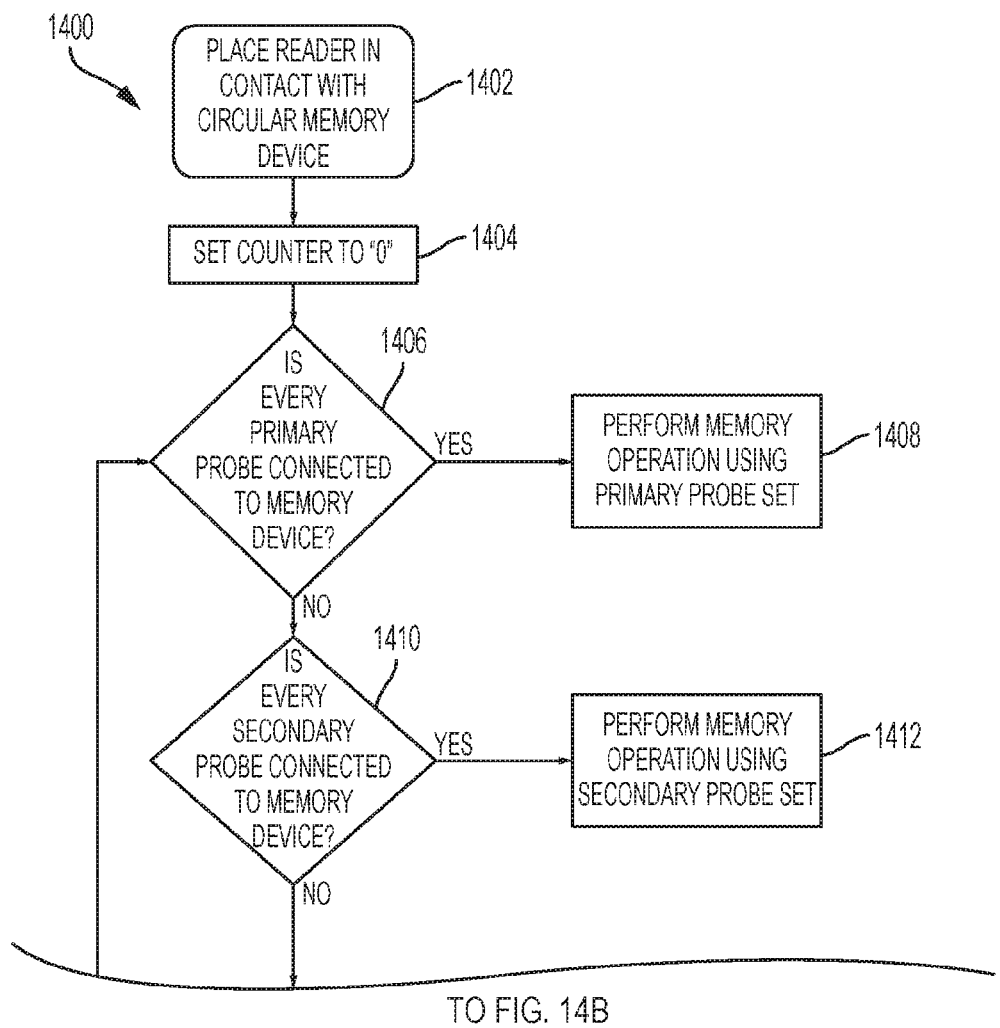
FIGS. 14A, 14B show a flow chart of a method that may be performed according to an implementation of the present teachings.
Figure 14B:
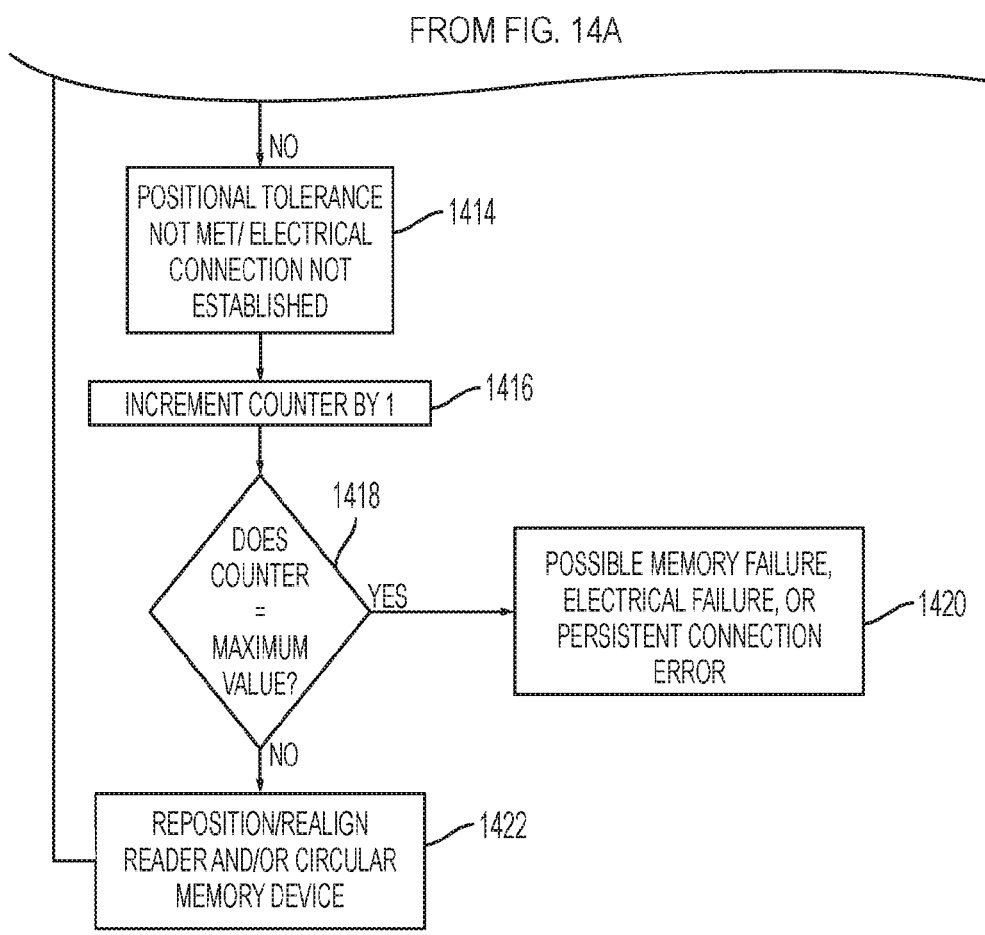

A method or process 1400 for performing a memory operation such as a read operation, a write operation, a functional test operation, a characterization test operation, or another operation on an IC 1300 such as a circular memory device 1300 is depicted in the flow diagram of FIGS. 14A, 14B. The method 1400 may proceed by operation or use of one or more of the structures depicted in the figures described above, and thus is described generally with reference to FIGS. 8 and 13; however, it will be appreciated that the method 1400 is not limited to any particular structure or use unless expressly stated herein. It will be appreciated that while the method 1400 is described as a series of acts or events, the present teachings are not limited by the ordering of such acts or events. Some acts may occur in different orders and/or concurrently with other acts or events apart from those described herein. Further, a method in accordance with the present teachings may include other acts or events that have not been depicted for simplicity, while other depicted acts or events may be removed or modified.

The method 1400 begins by placing the reader 800 in physical and/or electrical contact with the memory device 1300 as at 1402, and an optional counter may be initialized and/or set to "0" as at 1404. The reader 800 then performs a sensor operation to determine whether every primary probe 500, 502 is electrically connected or coupled to the memory device as at 1406. If the reader 800 confirms electrical connection at 1406, the memory operation is performed using the set of primary probes as at 1408. During the memory operation at 1408, the set of secondary probes 700, 702 may be electrically inactive (i.e., deactivated). If the electrical connection is not confirmed at 1406, the flow branches to 1410.

At 1410, the reader 800 performs a sensor operation to determine whether every secondary probe 700, 702 is electrically connected or coupled to the memory device 1300. If the reader 800 confirms electrical connection at 1410, the memory operation is performed using the set of secondary probes 700, 702 as at 1412. During the memory operation at 1412, the set of primary probes 500, 502 may be electrically inactive (i.e., deactivated). If the electrical connection is not confirmed at 1410, the flow branches to 1414. At 1414, the reader 800 has determined that positional tolerance between the reader 800 and the memory device 1300 has not been met and/or electrical connection has not been established. At 1416, the optional counter may be incremented by 1, and then a value of the counter is compared to a pre-established maximum as at 1418. If the counter value equals the maximum, it is determined that a possible memory failure (e.g., failure of the memory device), electrical failure (e.g., failure of the reader 800), and/or other persistent connection error (e.g., a foreign insulator material positioned between the memory device 1300 and the probes 500-504, 700, 702 of the reader 800) has occurred as at 1124, and appropriate correction may be performed.

If it is determined at block 1418 that the value of the counter is less than the pre-determined maximum, the reader 800 and/or the memory device 1300 may be repositioned and/or realigned as at 1422, and the flow may return to block 1406.

Figure 15:
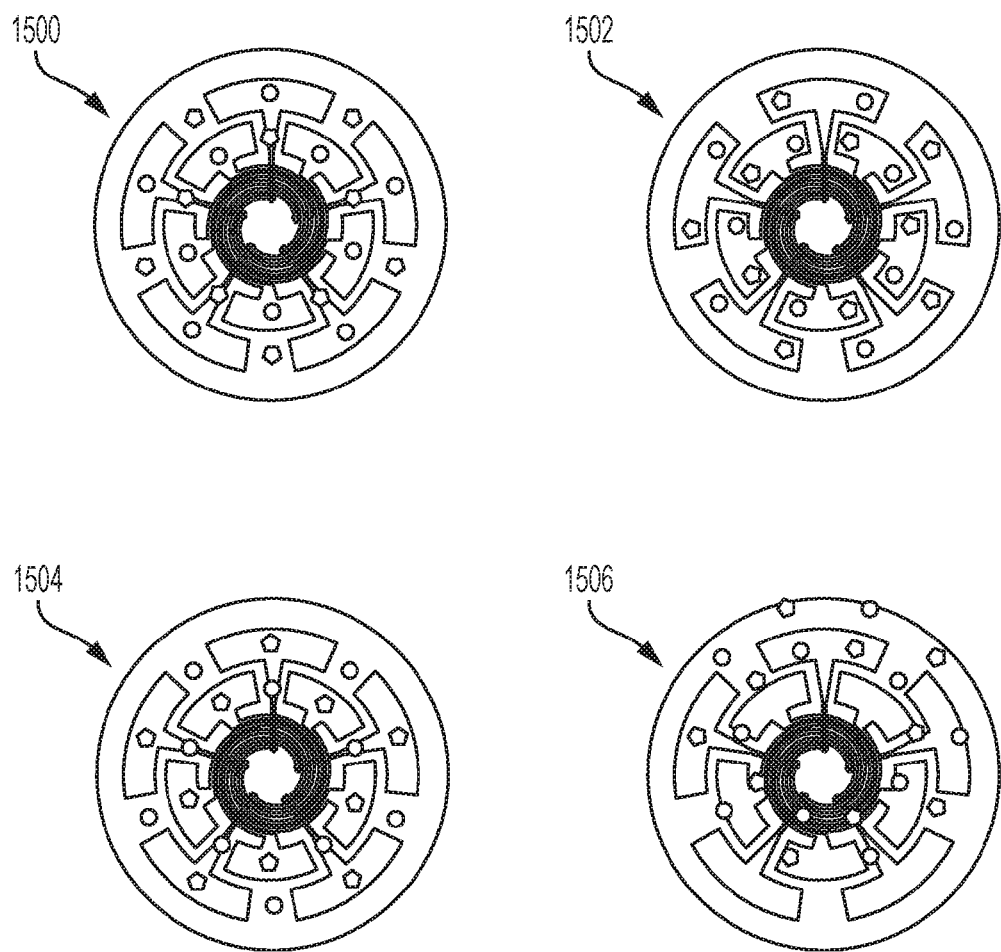
FIG. 15 depicts various possible alignments of a reader to the device of FIG. 13 during a method employing the flow chart of FIGS. 14A, 14B.

FIG. 15 depicts examples of physical and electrical connection states between the memory device 1300 and the various probes of the reader 800 that result in various decisions of the FIGS. 14A, 14B process flow. For example, either of states 1500, 1502, would result in a "yes" decision at block 1406, state 1504 would result in a "yes" decision at 1410, while state 1506 would result in a "no" decision at both of blocks 1406 and 1410.

A printed memory device 100, 1300 according the present teachings may be implemented using, for example, a gravure cylinder for manufacturing or using conventional printed memory fabrication techniques. Electronics and structures for the reader 800 may be designed and implemented by one of ordinary skill in the art from the description herein.

While a memory device including exactly five bottom electrodes, exactly five top electrodes, and 25 memory locations is described and depicted herein, it will be understood that a memory device with fewer than five or more than five bottom and top electrodes is contemplated. The number of bottom electrodes need not equal the number of top electrodes. In an implementation, the value of a° may range from about 52° to about 55°, the value of b° may range from about 17° to about 20°, the value of c° may range from about 24° to about 34°, and the value of d° may range from about 5° to about 9°. In another implementation, the value of a° may range from about 57° to about 60°, the value of b° may range from about 12° to about 15°, the value of c° may range from about 26° to about 36°, and the value of d° may range from about 3° to about 6°. In general circular memory device having five top electrodes and five bottom electrodes (i.e., N=5, or a device with 5-fold symmetry), a° may range from about 52° to about 62°, the value of b° may range from about 12° to about 20°, the value of c° may range from about 13° to about 36°, and the value of d° may range from about 3° to about 9°, where b°<c°+d°<a°. These values may vary depending on the device design, for different values of N, and for devices where the number of top electrodes is not equal to the number of bottom electrodes.

In an implementation, a memory system may include a circular memory device that may be a circular memory device 100, 1300 and a reader 800. A memory operation may be performed on the circular memory device regardless of a rotational orientation of the circular memory device relative to the reader.

In the exemplary depicted implementations, the extended members (e.g., 112) of the bottom electrodes (e.g., 104) are depicted as extending linearly from the contact pads (e.g., 110) toward the center "O" of the circular memory device (e.g., 100). Further, the extended members (e.g., 116) of the top electrodes (e.g., 108) are depicted as being interdigitated or interleaving spirals. It will be appreciated that the linear extended members and the spiraling extended members may be reversed, such that the bottom electrodes include interdigitated or interleaving spiral extended members while the top electrodes include linear extended members that extend linearly from the contact pads toward the center "O" of the circular memory device. Other device designs incorporating the present teachings will become apparent to those of ordinary skill in the art from the disclosure herein.

It will be appreciated that the bottom electrodes 104, 1304, the top electrodes 108, 1306, and the reader probes 500-504, 702, 704 will be typically formed from an electrically conductive material such as metal and/or a metal alloy that may include, for example, gold, silver, copper, aluminum, platinum, etc. The base substrate 102 may be a dielectric material, or may be a conductive material that is suitably electrically insulated from the bottom electrodes 104, 1304 and top electrodes 108, 1306 using, for example, a patterned or blanket layer of dielectric material (not individually depicted for simplicity).

It will be appreciated that the use of the term "optional" in the above disclosure is not intended to imply that other processing acts or device structures that are not expressly stated as being "optional" are required or not optional. As such, any claim that omits a processing act or structure not expressly recited above as being optional is intended to reflect that the processing act or structure is optional in the claimed implementation.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A memory device, comprising:
    a plurality of bottom electrodes comprising a plurality of bottom electrode contact pads and a plurality of bottom electrode extended members, wherein:
        each of the plurality of bottom electrode contact pads is in electrical communication with one of the bottom electrode extended members;
        each of the plurality of bottom electrode contact pads comprises a first arc-shaped midline bisecting the bottom electrode contact pad and positioned at a first radius from a center of the memory device; and
        a perimeter of each bottom electrode contact pad defines an annular sector bisected by the first arc-shaped midline;
    a plurality of top electrodes comprising a plurality of top electrode contact pads and a plurality of top electrode extended members, wherein:
        each of the plurality of top electrode contact pads is in electrical communication with one of the top electrode extended members;
        each of the plurality of top electrode contact pads comprises a second arc-shaped midline bisecting the top electrode and positioned at a second radius from the center of the memory device, wherein the first radius is different from the second radius; and
    a ferroelectric layer positioned between the plurality of bottom electrode extended members and the plurality of top electrode extended members.

2. The memory device of claim 1, wherein at least one of the plurality of bottom electrode extended members and the plurality of top electrode extended members are arranged in interleaving, non-intersecting spirals.

3. The memory device of claim 1, wherein each of the plurality of top electrode extended members cross over every bottom electrode extended member of the plurality of bottom electrode extended members at a crossover point.

4. The memory device of claim 3, further comprising a memory storage location positioned at every crossover point.

5. The memory device of claim 1, wherein:
    at least one of the plurality of bottom electrode extended members and the plurality of top electrode extended members are arranged in interleaving, non-intersecting spirals;
    each of the plurality of top electrode extended members cross over every bottom electrode extended member of the plurality of bottom electrode extended members at a crossover point; and
    the memory device further comprises a memory storage location positioned at every crossover point.

6. The memory device of claim 1, wherein the memory device comprises exactly five bottom electrodes and exactly five top electrodes, and each bottom electrode contact pad and each top electrode contact pad extends along an arc of from 52° to 62°.

7. The memory device of claim 1, further comprising a center contact pad having a perimeter that defines a circle, wherein the center contact pad is electrically coupled with only one bottom electrode of the plurality of bottom electrodes.

8. The memory device of claim 7, wherein the center contact pad and the only one bottom electrode electrically coupled therewith provides an orienting electrode configured to provide a rotational orientation of the memory device during a memory operation.

9. A memory system, comprising:
    a circular memory device, comprising:
        a plurality of bottom electrodes comprising a plurality of bottom electrode contact pads and a plurality of bottom electrode extended members, wherein:
            each of the plurality of bottom electrode contact pads is in electrical communication with one of the bottom electrode extended members;
            each of the plurality of bottom electrode contact pads comprises a first arc-shaped midline bisecting the bottom electrode contact pad and positioned at a first radius from a center of the circular memory device; and a perimeter of each bottom electrode contact pad defines an annular sector bisected by the first arc-shaped midline;

a plurality of top electrodes comprising a plurality of top electrode contact pads and a plurality of top electrode extended members, wherein:

each of the plurality of top electrode contact pads is in electrical communication with one of the top electrode extended members;

each of the plurality of top electrode contact pads comprises a second arc-shaped midline bisecting the top electrode and positioned at a second radius from the center of the circular memory device, wherein the first radius is different from the second radius; and a ferroelectric layer positioned between the plurality of bottom electrode extended members and the plurality of top electrode extended members; and a reader configured to perform a memory operation on the circular memory device, the reader comprising a plurality of probes configured to electrically couple to the plurality of bottom electrode contact pads and the plurality of top electrode contact pads.

10. The memory system of claim 9, the plurality of probes comprising a plurality of primary probes and a plurality of secondary probes, wherein:

the plurality of secondary probes is configured to be inactive when each primary probe from the plurality of primary probes is in electrical communication with one of the bottom electrode contact pads or with one of the top electrode contact pads during the memory operation; and the plurality of primary probes is configured to be inactive, and the plurality of secondary probes is configured to perform the memory operation, when at least one of primary probes is not in electrical communication with one of the bottom electrode contact pads or with one of the top electrode contact pads during the memory operation.

11. The memory system of claim 10, wherein:

each bottom electrode contact pad and each top electrode contact pad extends along an arc of from 52° to 62°; and the plurality of secondary probes is rotationally offset from the plurality of primary probes by from 13° to 36°.

12. The memory system of claim 11, wherein:

the circular memory device further comprises a center contact pad comprising a perimeter that defines a circle;

the center contact pad is electrically coupled with only one bottom electrode of the plurality of bottom electrodes; and the reader further comprises a center contact probe configured to electrically couple to the center contact pad during the memory operation.

13. The memory system of claim 9, wherein at least one of the plurality of bottom electrode extended members and the plurality of top electrode extended members are arranged in interleaving, non-intersecting spirals.

14. The memory system of claim 9, wherein each of the plurality of top electrode extended members cross over every bottom electrode extended member of the plurality of bottom electrode extended members at a crossover point.

15. The memory system of claim 14, further comprising a memory storage location positioned at every crossover point.

16. The memory system of claim 9, wherein:

at least one of the plurality of bottom electrode extended members and the plurality of top electrode extended members are arranged in interleaving, non-intersecting spirals;

each of the plurality of top electrode extended members cross over every bottom electrode extended member of the plurality of bottom electrode extended members at a crossover point; and the circular memory device further comprises a memory storage location positioned at every crossover point.

17. A method for performing a memory operation on a circular memory device, comprising:

placing a reader in physical contact with the circular memory device;

detecting whether every primary probe of a plurality of primary probes of the reader is electrically coupled to one electrode of a plurality of electrodes of the circular memory device;

responsive to every primary probe of the plurality of primary probes being electrically coupled to one electrode of the plurality of electrodes, performing the memory operation on the circular memory device using the plurality of primary probes;

responsive to every primary probe of the plurality of primary probes not being electrically coupled to one electrode of the plurality of electrodes, detecting whether every secondary probe of a plurality of secondary probes of the reader is electrically coupled to one electrode of the plurality of electrodes of the circular memory device; and responsive to every secondary probe of the plurality of secondary probes being electrically coupled to one electrode of the plurality of electrodes, performing the memory operation on the circular memory device using the plurality of secondary probes.

18. The method of claim 17, further comprising:

responsive to every secondary probe of the plurality of secondary probes not being electrically coupled to one electrode of the plurality of electrodes, repositioning or realigning the reader relative to the circular memory device; and performing the detecting whether every primary probe of the plurality of primary probes of the reader is electrically coupled to one electrode of the plurality of electrodes of the circular memory device.

19. The method of claim 17, further comprising:

detecting whether a center pad probe of the reader is electrically coupled to one of the primary probes of the plurality of primary probes;

responsive to the center pad probe of the reader being electrically coupled to the one of the primary probes, performing the detecting of whether every primary probe is electrically coupled to one electrode of the plurality of electrodes; and responsive to the center pad probe not being electrically coupled to one of the primary probes, detecting whether the center pad probe is electrically coupled to one of the secondary probes of the plurality of secondary probes.

20. The method of claim 19, further comprising, responsive to the center pad probe not being electrically coupled to one of the secondary probes, repositioning or realigning the reader relative to the circular memory device.

* * * * *